United States Patent [19]

Snyder

[11] 4,430,758
[45] Feb. 7, 1984

[54] SUSPENDED-SUBSTRATE CO-PLANAR STRIPLINE MIXER

[75] Inventor: Richard V. Snyder, Ringwood, N.J.

[73] Assignee: Scientific Component Corporation, Brooklyn, N.Y.

[21] Appl. No.: 384,556

[22] Filed: Jun. 3, 1982

[51] Int. Cl.³ .............................................. H04B 1/26
[52] U.S. Cl. .................................. 455/227; 455/330; 333/26; 333/247
[58] Field of Search ....................... 455/326, 327, 330; 333/26, 104, 161, 164, 247, 262

[56] References Cited

U.S. PATENT DOCUMENTS 3,772,599 11/1973 Ernst et al. ........................... 455/327
4,118,670 10/1978 Dickens .............................. 455/327
4,383,227 5/1983 De Ronde ............................ 333/26

Primary Examiner—Jin F. Ng
Attorney, Agent, or Firm—Ratner & Prestia

[57] ABSTRACT

A coplanar strip line compensated balun coupled to a double balanced strip line mixer circuit where the strip lines of the balun have a predetermined radius of curvature and adjusted gap widths to provide for isolation between input and output and for impedance matching over a broad band input. The curvature is adjusted to produce proper inductance for producing input/output isolation. The spacing of the gap width provides for proper capacitive coupling of the transmitted energy between the strip lines since the entire circuit is separated from a ground plane and printed on a lossless dielectric substrate.

8 Claims, 3 Drawing Figures

SUSPENDED-SUBSTRATE CO-PLANAR STRIPLINE MIXER

BACKGROUND OF THE INVENTION

A. Field of the Invention

This invention relates to microwave mixers and more particularly to coplanar strip line mixers.

B. Background Art

It is well known in the art that the basic circuit of a mixer, or frequency converter, consists of a microwave structure which combines two signals and feeds them into at least one mixer diode whose nonlinear characteristics provide mixing or frequency conversion. The frequency conversion involves the use of the nonlinear properties of the diodes to create difference-frequency (IF) voltages which are then amplified. Specifically, a local oscillator provides an inphase signal (LO) to the mixer. A radio carrier signal at a particular frequency (RF) is also provided to the mixer diode configuration. The mixer modulates the radio carrier signal amplitude with the LO signal thereby forming a modulated carrier signal having difference frequencies or intermediate frequencies (IF) i.e. the difference between RF frequency and LO frequency. The intermediate frequency signals have the same phase and can be combined together to provide the composite output. The mixer essentially acts as an IF amplifier. The current through the mixer diodes configuration is a function of the sum of the LO signal and the RF signal.

An important feature of balanced mixers is the isolation provided between the RF signal input port and the LO signal input port. If the RF signal came from a receiving antenna, the isolation would prevent energy provided at the LO input port from being transmitted to the antenna and possibly radiating into space. Since it is a very difficult task to match the mixer diodes perfectly at all frequencies and under all LO drive conditions, the isolation between the RF input port and LO input port is a function of the return loss of the diodes.

Generally, desirable characteristics of a balanced mixer include amplitude modulated (AM) noise cancellation, LO to RF isolation and simplicity of construction. A double balanced mixer may be constructed using toroidal transformers or strip line techniques. There are several types of doubly balanced microwave mixers including the balun-ring, disclosed by Neuf in U.S. Pat. No. 3,652,941, and star configurations. However, the type most frequently used for strip line construction is the pseudo double balanced mixer. This consists of two conventional balanced mixers built using either 90 degree or 180 degree hybrids placed between two isolating 90 degree hybrids. Thus, the RF signal splits to both balanced mixers as does the local oscillator input signal. Because of the circuit configuration, the LO and RF signal leakages through the balanced mixers are shunted to the isolating hybrids. Similarly, the reflections from the two balanced mixers are shunted into the hybrid loads, thus providing a mixer which has good LO to RF signal isolation and good voltage standing wave ratio (VSWR) at all ports. Also see Gupta, Stripline Circuit Design, pages 269-291 incorporated herein by reference.

The output IF signal bandwidths is a function of both the RF frequency of the mixer as well as its doubly balanced configuration. Strip line mixers are commonly built with IF frequencies and bandwidths going up to several hundred MHz, with 500 MHz being a reasonable upper limit for conventional design.

Balanced mixers have LO to RF isolations which are a function of their circuit types. However, doubly balanced mixers have an inherently higher degree of LO to RF isolation as a result of their dual hybrid construction. Typically, minimum levels of isolation equal to 20 dB can be anticipated, with even higher isolation over narrow frequency ranges. Furthermore, as in the case of isolation, the doubly balanced mixer solves the problem of reduced VSWR. Doubly balanced mixers can be typically expected to operate at VSWR's less than 1.5, i.e. providing large reflection with a high degree of isolation.

There are three basic diode types which are applicable to a mixer design. These are the point-contact diode, the back diode (a variation of the tunnel diode) and the Schottky diode. Point-contact diodes have high RF impedances which generally makes their matching somewhat difficult over broad bandwidths. Back diodes have low RF impedances which makes them readily matched over a broad frequency range. The impedances of Schottky diodes is more dependent upon LO drive level than is the impedance of either the back diode or the point-contact diode. Thus, with proper LO drive, it is possible to match a Schottky diode over an extremely broad bandwidth, up to and including 20:1. Also, application of a dc bias improves the match of a Schottky device over a broad band width, particularly in the higher frequency ranges. At high frequencies, the parasitic inductance values of the diode configurations cannot be ignored since they limit the isolation to 20dB and less for a single diode mounted in a 50 ohm line.

Baluns have been used as the coupling device for connecting local oscillator signals to mixer circuits. A balun is the common name for an unbalanced-to-balanced converter. Baluns have been constructed for microwave applications using either waveguide or coaxial line techniques. The function of the balun is to convert an unbalanced grounded signal into a balanced ungrounded signal for circuits operating in a ground isolation mode. Although compensated coaxial line and waveguide-type baluns have been developed, their use is limited because of their size and unfavorable electrical characteristics.

In a strip line balanced mixer circuit, a coupling device must also be provided for connecting the local oscillator signal to the mixer circuit. Coaxial lines or waveguide-type baluns cannot be used because of their incompatibility with strip line design. Previously the coupling device used was a strip line coupler circuit consisting of several quarter wavelength strip lines which could be larger than the mixer itself. However, one of the benefits of strip line circuit elements are their small size. Therefore, a coupler having strip lines larger than the mixer itself would not be acceptable for many applications.

When attempting to reduce the size of a balun-mixer fully coplanar strip line circuit, structural, topological problems become apparent.

Specifically, in designing a fully coplanar strip line analogy to a coaxial line circuit, it is not necessary to physically connect the strip lines to the mixer diodes if the strip lines are curved to within a predetermined special distance from the mixer diode configuration. However, by curving the strip lines to conform to a coaxial line configuration, the analogous characteristics of a coaxial line mixer circuit no longer exist because one strip line representing the inner conductor of a coaxial line will be shorter than the other strip line that represents the coaxial outer conductor. It, therefore, becomes necessary to make compensation in gap spacing between strip lines and to optimize the radius of curvature of the strip lines. Otherwise, if the strip lines were not curved, a straight section of coplanar strip line would have to be connected to the diode configuration by an indeterminate length of wire that would be outside the plane of the striplines.

Therefore, an object of this invention is a fully coplanar strip line mixer circuit coupled to a balun that provides optimal isolation between the LO input port of the balun and the RF input port of the mixer.

Another object of this invention is a coplanar strip line circuit having an impedance that matches the impedance of any other device used with it as a function of the mixer diode characteristic.

SUMMARY OF THE INVENTION

A suspended-substrate co-planar stripline mixer is formed by electrically coupling together a strip line compensated balun and a strip line mixer. The balun has two parallel strip line sections equidistantly spaced apart from each other. At one end of each of the strip line sections are oppositely curved strip line portions each having the same radius of curvature. The mixer has an integrated diode quad directly coupled to a strip line output terminal. The diode quad also has input terminals. The mixer further includes a curved interior strip line segment opposite the output terminal and equidistantly spaced from and having a smaller radius of curvature than both oppositely curved strip line portions. In this manner there is provided electrical isolation between the balun strip line sections and the output terminal of the mixer and capacitive coupling of energy from the balun strip line sections to the strip line output terminal.

DESCRIPTION OF THE PREFERRED EMBODIMENT

Figure 1:
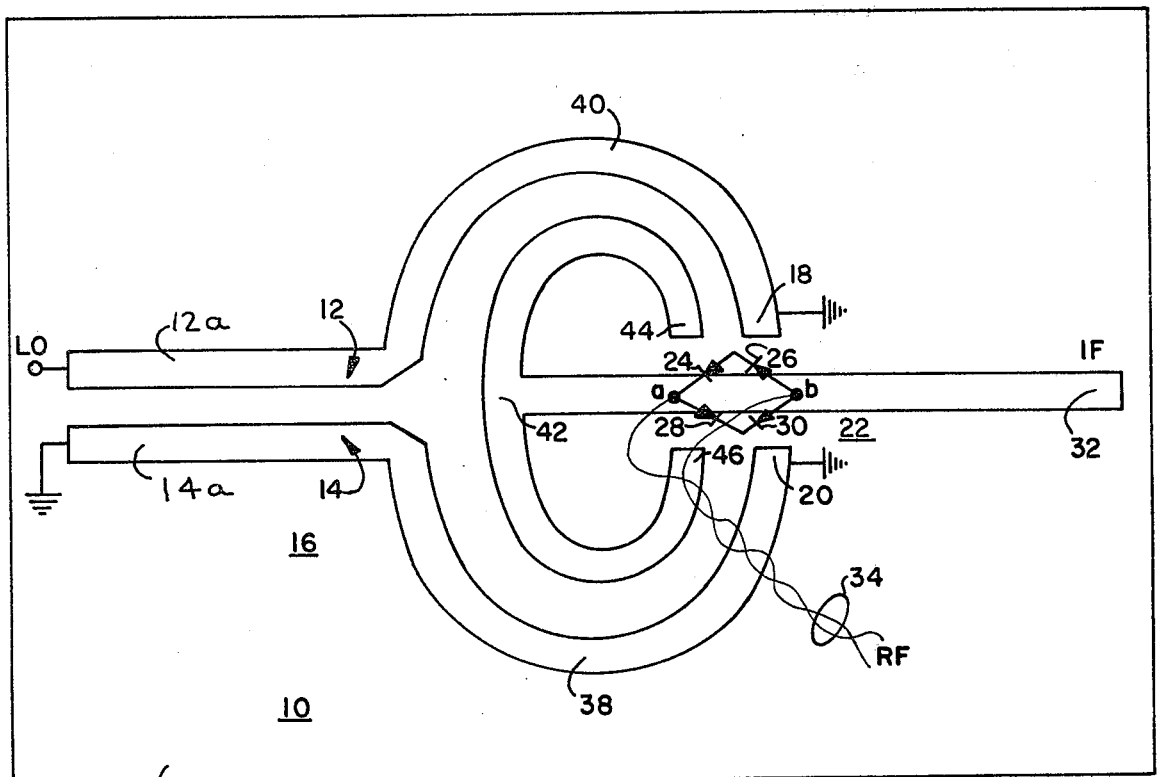
FIG. 1 is a plan view of the suspended substrate coplanar strip line mixer of the invention.

Referring to FIG. 1, there is shown a suspended-substrate coplanar strip line mixer 10 which includes balun 16 and a strip line mixer 22. Balun 16 is a strip line compensated balun formed by a first strip line section 12 and a second strip line section 14. Section 12 has a straight strip line portion 12a and a curved "inner" strip line portion or segment 40. Section 14 has a straight portion 14a equidistant from portion 12a and a curved "outer" strip line portion or segment 38. Mixer 22 has a strip line output terminal 32, an integrated diode quad 48 and a curved interior strip line portion or segment 42.

Local oscillator signals, LO, are applied to portion 12a of first strip line section 12 which is parallel to portion 14a of second grounded strip line section 14. Sections 12 and 14 are analogous to the inner and outer conductors of a coaxial cable respectively. Strip lines 12 and 14 are adjusted lengthwise to provide a predetermined impedance to the local oscillator, i.e., a one-quarter wavelength line would present an impedance of 50 ohms to the local oscillator. Strip line sections 12 and 14 are elements of balun 16. The balanced output from balun 16 appears at strip line end portions 18 and 20.

Mixer circuit 22 includes a ring configuration of diodes 24, 26, 28 and 30 forming integrated diode quad 48 directly coupled to an IF output terminal 32. A mixer input signal (RF) is applied along lines 34 which are coupled to the mixer at points a and b.

In order to connect balun 16 with mixer 22, adjustments in the curvature of curved segments 40, 38 of strip lines 12 and 14 respectively of the balun are required above a certain frequency to provide for isolation between the LO input and the RF input and to provide for impedance matching with any device that may be used with circuit 10. The reason for the adjustments is that curved strip lines do not represent a true section of a curved coaxial line. Circuit 10 is a lumped element circuit since it is printed on low loss dielectric substrate support 36, but separated from a ground plane by more than 0.060 to eliminate fringing field interaction. As a result, performance of the mixer is independent of substrate type or thickness. The circuit, therefore, would substantially represent the lumped analog of a coaxial line balun. The electromagnetic field is between the strip lines because circuit 10 is uncoupled to ground. Therefore, to obtain isolation between LO and RF or, more accurately, between LO input and IF output, outer strip line segment 38 and inner strip line segment 40 must be curved by adjusting the radius of curvature of the segments so as to provide the proper inductance for isolation. Without isolation there would be no broad band input impedance matching. Furthermore, the gap width between both the inner and outer strip line segments 40, 38 and interior strip line segment 42 must be adjusted to compensate for the missing capacity due to the fact that interior strip line segment 42 is shorter than both outer and inner strip line segments 38 and 40. In other words, curvature of the strip line segments must be adjusted to produce sufficient inductance to provide for desirable input/output isolation and to provide for the capacitive coupling of the energy between the strip lines.

The spacial relationship between the strip lines of the curved coplanar strip line circuit 10 is very important. If interior strip line segment 42 is too much shorter than outer strip line segment 38, then strip line circuit 10 becomes a degenerate capacitor and no longer represents a lumped analog element to a coaxial balun. Energy travels from LO input to IF output and is fundamentally capacitively coupled between these strip lines. Energy traveling back along outer segment 38 is prevented from reaching the LO input due to the inductance that reflects the energy in the opposite direction along the outer conductor. Therefore, the capacitance is adjusted between the strip lines to provide for matching the energy traveling from LO input to IF output and the curvature between the strip line segments is adjusted to provide isolation from IF output to LO input. Furthermore, obtaining the proper gap spacing and radius of curvature also defines what the frequency response of circuit 10 will be. Although the preferred embodiment shows two curved strip line segments, it is understood that more than two curved strip lines may be used in a multiconductor mixer circuit.

Circuit 10 operates over a much broader frequency band than prior art devices since the matching impedances may be easily and precisely adjusted based on adjustments in strip line gap width spacing and radius of curvature. An optimal strip line radius of curvature must be obtained because a strip line curvature that is less than optimal will create insufficient isolation between the input and output of the circuit. Curvature greater than the optimum radius of curvature will create capacitive coupling from one end of the balun to the other. In the latter case, the energy would be capacitively coupled from the output of the curved strip lines to the input of the curved strip lines without going through the curved portion of the strip lines.

Figure 2:
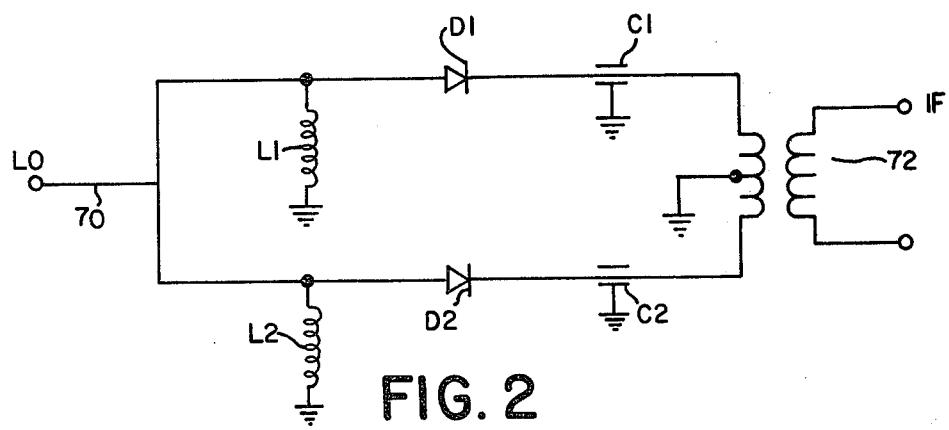
FIG. 2 is a mixer circuit substantially equivalent to the mixer of FIG. 1.
Figure 3:
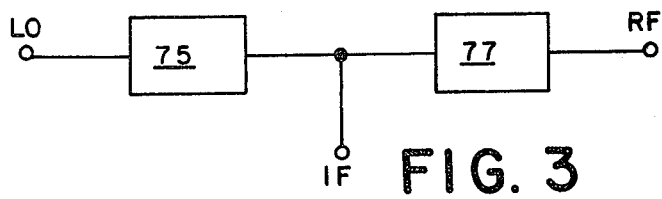
FIG. 3 is a block diagram of the mixer of FIG. 1.

In order to more easily understand the invention, circuit and block diagrams are set forth in FIGS. 2 and 3. More specifically, a balanced mixer circuit, substantially equivalent to FIG. 1, is shown in FIG. 2. A local oscillator provides an in-phase signal (LO) to mixer diodes, D1 and D2. In order to isolate the input port 70 and output port 72, energy returning to the input port is totally reflected by inductances, L1 and L2. RF frequencies are blocked by RF by-pass capacitors C1 and C2 providing IF output signals at output port 72. The frequencies of the IF output signals amount to the difference between the RF frequencies and the LO frequencies.

A block diagram of the mixer of FIG. 1 is shown in FIG. 3. Again, a local oscillator signal (LO) is provided to balun 75. RF signals are provided to mixer 77 having diode mounts. The difference between the RF signals and the LO signals provide IF output.

The circuit of FIG. 1 may be used as a phase shifter or as a switch. The balun portion of the circuit of FIG. 1 may be used as the E arm of a magic T, as a feed for spiral antennas and as the balun element in most filter networks. Because of the difficulties involved in amplification at microwave frequencies, microwave receivers, such as those used in radar systems, almost always incorporate balanced mixer circuits.

What is claimed is:

1. A suspended-substrate coplanar mixer comprising:
a strip line compensated balun including a first strip line section having (1) a straight portion and (2) a curved portion forming an inner strip line segment and a second strip line section having (1) a straight portion equidistantly spaced apart from said straight portion of said first strip line section and (2) a curved portion forming an outer strip line segment, the curved portions oppositely curved facing away from each other and each having substantially the same radius of curvature, and
a strip line mixer including an integrated diode quad having input means, a strip line output terminal directly coupled to said diode quad, a curved interior strip line segment disposed within, equidistantly spaced from and having a smaller radius of curvature than both of said outer and said inner strip line segments for providing electrical isolation between said balun and said output terminal and capacitively coupling energy between equidistantly spaced strip lines.

2. The mixer of claim 1 in which said first strip line section is adapted to transmit local oscillator signals.

3. The mixer of claim 2 in which said second strip line section is grounded.

4. The mixer of claims 2 or 3 in which there is provided means for producing an RF mixer input signal for application to said input means of said diode quad.

5. The mixer of claim 1 in which the thickness of said substrate is greater than 0.060.

6. The mixer of claim 5 in which said substrate is a low loss dielectric.

7. The mixer of claim 4 in which said electrical isolation is a function of the radii of curvature of said inner, outer and interior strip lines.

8. The mixer of claim 7 in which said capacitive coupling is a function of the distance between said equidistantly spaced strip lines and said mixer provides for broad band impedance matching of energy from said first strip line section to said output terminal.

* * * * *